United States Patent [19]

Cook et al.

[11] Patent Number: 5,346,579
[45] Date of Patent: Sep. 13, 1994

[54] MAGNETIC FIELD ENHANCED PLASMA PROCESSING CHAMBER

[75] Inventors: Joel M. Cook, Pleasanton; John R. Trow, Santa Clara, both of Calif.

[73] Assignee: Applied Materials, Inc., Santa Clara, Calif.

[21] Appl. No.: 93,445

[22] Filed: Jul. 19, 1993

Related U.S. Application Data

[63] Continuation of Ser. No. 780,667, Oct. 17, 1991, abandoned.

[51] Int. Cl.$^5$ .............................................. H01L 21/00
[52] U.S. Cl. ..................................... 156/345; 156/643; 204/298.37; 204/298.38; 204/298.16
[58] Field of Search ................ 156/345, 643; 118/723; 204/298.37, 298.38, 298.16

[56] References Cited

U.S. PATENT DOCUMENTS

| | | | |
|---|---|---|---|
| 4,483,737 | 11/1984 | Mantei | 156/345 |
| 4,745,337 | 5/1988 | Pichot et al. | 118/723 |
| 4,842,683 | 6/1989 | Cheng et al. | 156/345 |
| 5,032,202 | 7/1991 | Tsai et al. | 156/345 |
| 5,032,205 | 7/1991 | Hershkowitz et al. | 156/345 |
| 5,133,825 | 7/1992 | Hakamata et al. | 117/723 |
| 5,133,826 | 7/1992 | Dandl | 118/723 |

FOREIGN PATENT DOCUMENTS

| | | | |
|---|---|---|---|
| 396398 | of 0000 | European Pat. Off. | H01J 37/32 |
| 62-147733 | 7/1987 | Japan | |
| 2082524 | 3/1990 | Japan | |

OTHER PUBLICATIONS

EP Search Report.

*Primary Examiner*—Brian E. Hearn
*Assistant Examiner*—George A. Goudreau
*Attorney, Agent, or Firm*—Birgit E. Morris

[57] ABSTRACT

A plasma etch reactor comprising a remote source of plasma mounted on a vacuum processing chamber has a large permanent magnet ring around the area of the chamber where the plasma enters, magnetically oriented so that magnetic field lines are removed from said plasma in the processing chamber, and two or more pairs of magnet rings mounted around said chamber to form a series of magnetic cusps about the wall of said chamber, to thereby inhibit plasma electrons from striking the wall of said chamber. A substrate entry port can be fitted between the magnet rings, allowing automatic ingress and egress of said substrates with maximum efficiency.

8 Claims, 4 Drawing Sheets

MAGNETIC FIELD ENHANCED PLASMA PROCESSING CHAMBER

This is a continuation of U.S. application Ser. No. 07/780,667 filed Oct. 17, 1991, now abandoned.

This invention relates to plasma reactors for fabricating integrated circuits and other electronic devices on substrates, and more particularly to a plasma etch reactor providing improved processing uniformity.

BACKGROUND OF THE INVENTION

Magnetic field-enhanced RIE plasma etching systems are known. In an attempt to improve the efficiency of plasma generation and etch uniformity, RIE etching has been combined with a magnetic field. Electrons generated in the RIE source have longer mean field paths in the presence of a magnetic field, resulting in more collisions with neutral species in the reactant etch gases and the generation of more ions. This improved generation of ions does not require more RF power however.

A typical prior art system is shown in FIG. 1. The reactive ion etching (RIE) mode etch reactor 40 comprises a cylindrical vacuum chamber 41 containing a cathode assembly 42 which acts as a mount for the substrate to be etched. A power supply system 46, such as a 13.6 MHz RF power supply and a load matching network, is connected to the cathode. The walls 47 of the chamber act as the anode. Reactant gas is fed to the chamber via an inlet port 48 from a gas supply system 49 to a showerhead 51 within the chamber 41. Spent gases and by-products are removed via an exhaust system 50.

Electromagnets 54 and 56 are circumferentially positioned about the chamber 41 near the top and bottom thereof. The electromagnets form north and south poles which are reversible by reversing the coil current.

These systems provide a relatively high etch rate even with the use of relatively low pressures within the etch chamber. Thus they can provide high throughput of substrates to be processed without sacrificing the selectivity and directionality of the ions from the plasma with respect to the substrate to be etched. Further, since the substrate to be etched constitutes only a small part of the surface area within the etch chamber, magnetic fields parallel to the walls of the chamber can inhibit electron loss on the walls. Thus the plasma density will be maintained even though the total pressure is quite low. This process further improves the uniformity of the plasma.

However, the low pressure inside the chamber does lead to certain non-uniformities in the plasma, and this in turn leads to non-uniform etching. These non-uniformities become more important as the features sizes of semiconductor devices become smaller and the size of the wafers becomes larger.

Improvements in the above equipment have been suggested by Mantei in U.S. Pat. No. 4,483,737. This reference discloses a line multicusp arrangement of parallel lines of permanent magnets placed around the exterior of the process chamber arranged in straight line segments with alternating north and south poles facing inwardly toward the center of the chamber, the magnets thus being parallel to the plasma flow direction. The magnetic field generated by the axial line cusp arrangement is perpendicular to the plasma flow direction. The resultant interior magnetic field cusps about the walls confine the plasma and reduce losses of electrons to the walls of the chamber. This reduces the amount of power required to obtain the desired plasma density, while the uniformity of the plasma is increased.

However, the resultant etch apparatus has several disadvantages; because of the placement of the external magnets, the substrates cannot be admitted to and removed from the etch chamber from a position parallel to the etch position without disrupting the line of magnets, which would lead to non-uniformities in the plasma. Thus the substrate is generally admitted to the chamber below the line of magnets onto the cathode, which must be raised to an etch position within the chamber and lowered again after processing. This requires complex equipment and requires time, reducing the throughput of the equipment.

Further, it is preferred that there be no magnetic field at all in the vicinity of the substrate surface during etch processing.

Thus improvements in the RIE etch chamber to reduce electron losses and non-uniformities, to reduce the magnetic field in the area of the substrate and to improve automatic or robotic access to the chamber and increase throughput is greatly to be desired.

SUMMARY OF THE INVENTION

The improved magnetic field enhanced etching apparatus of the invention has magnets disposed in a series of rings parallel to each other and to a plane of a substrate to be etched around the outside of an etching chamber, resulting in a series of improvements both to etch uniformity and to substrate throughput. Further, to accommodate plasma sources with strong magnetic fields, a larger ring magnet can be disposed on the top of the chamber to further reduce the magnetic field in the area surrounding the substrate to be etched and improve the uniformity of the plasma etching within the chamber.

DETAILED DESCRIPTION OF THE INVENTION

Figure 1:
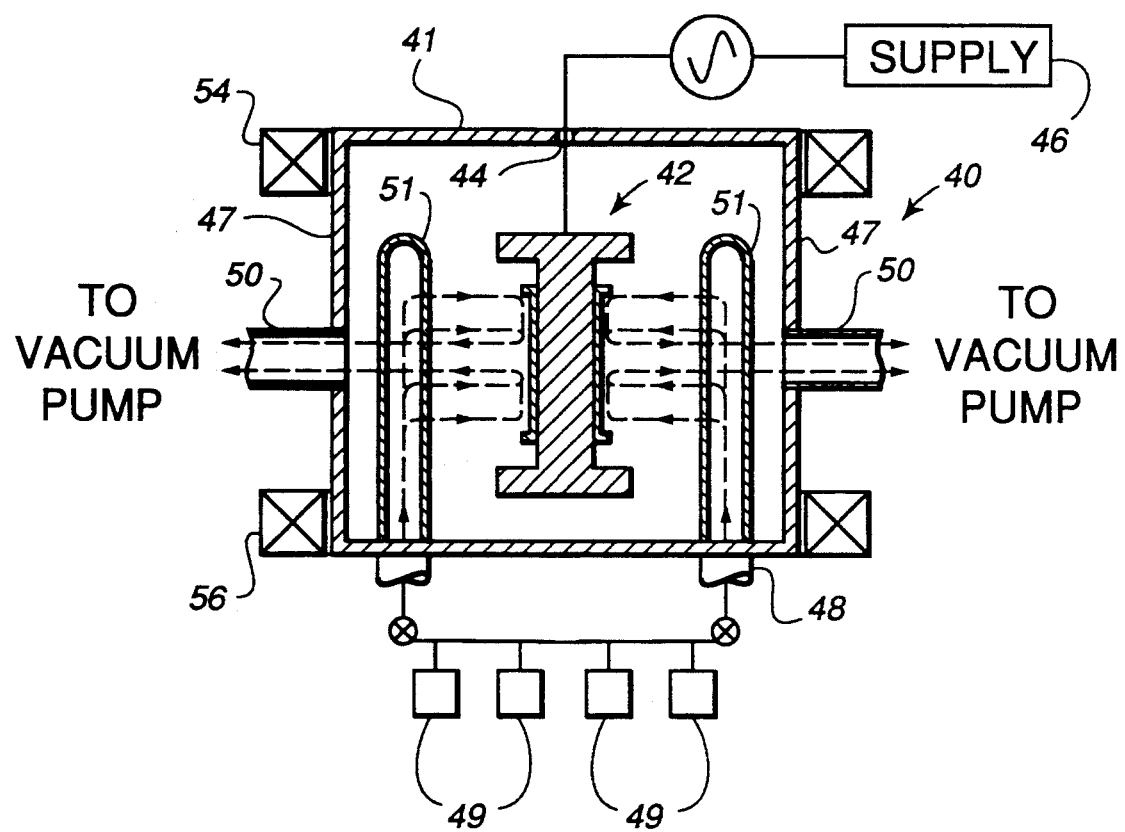
FIG. 1 is a perspective view of a magnetically enhanced prior art RIE mode plasma etch system.

The invention will be described with reference to the Drawing.

Figure 2:
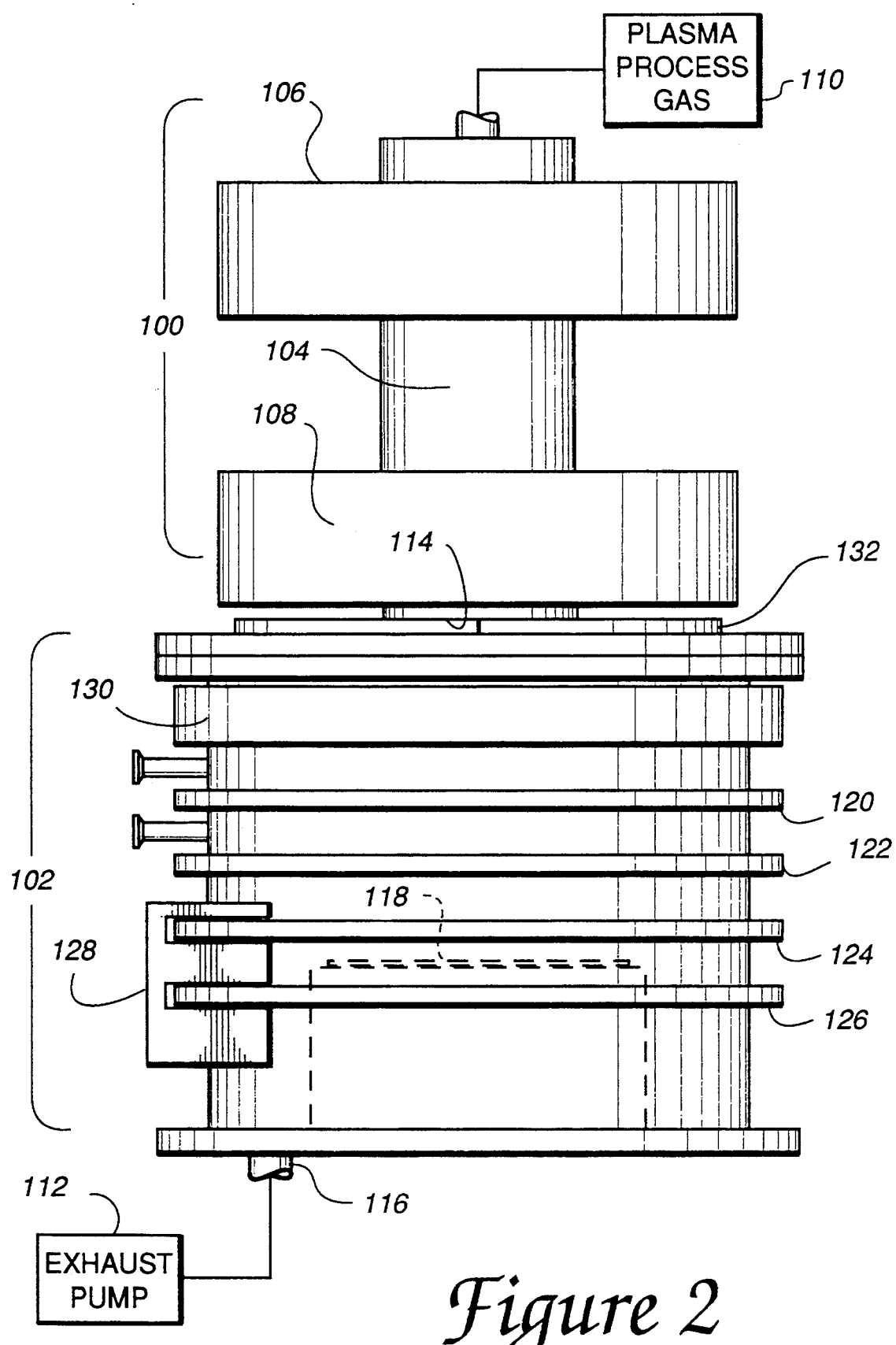
FIG. 2 is an external front elevational view of a reactor having a cylindrical plasma source mounted on top of a cylindrical plasma etching chamber housing a cylindrical substrate chuck shown with dashed lines.

FIG. 2 is an external front elevational view of a plasma reactor 102 of the invention. A cylindrical plasma source 100, such as an ECR source, is mounted on top of the cylindrical plasma processing chamber 102. The plasma source 100 can be an electron cyclotron resonance (ECR) plasma source having a housing 104 that encloses a chamber within which a plasma is generated. A top coil 106 and a bottom coil 108 are coupled to a source of current (not shown) to produce a magnetic field of a strength on the order of about 875 Gauss. This magnetic field results in electron paths describing circular orbits around which the generated electrons circle at a frequency of about 2.455 GHz. These choices of magnetic field strength and frequency are made so that a commercially available power source at 2.455 GHz can be used to pump energy into their circling electrons. The top coil 106 is supplied by a current of 135–180 amps and the bottom coil 108 is supplied by a current of 100–110 amps. The typical magnetic field produced by the top coil is about 900–1000 Gauss.

A gas source 110 provides a plasma process gas, typically at a flow rate of about 70–5000 sccm. An exhaust pump 112 withdraws process gases and reaction by-products at a rate sufficient to produce a pressure within the processing chamber 102 of approximately 0.5–5 millitorr.

The plasma processing chamber 102 comprises a port 114 for the entry of the generated plasma from the plasma source, an exhaust port 116 for exhausting spent gases and reaction by-products, and a cathode mount 118 (shown in dashed lines) for the substrate to be processed.

A series of at least two pairs of multicusp permanent ring magnets 120, 122, 124 and 126 are fastened to the outside of and surround the plasma processing chamber 102 in a direction parallel to the plane of the substrate and parallel to each other, but perpendicular to the direction of plasma transport from the plasma source. This arrangement produces a ring multidipole magnetic field that confines the electrons within the etching chamber 102. Each of the magnet pairs 120 and 124 is polarized such that the North pole of each of these magnets is directed toward a cylindrical axis of the plasma reactor 102. The other pair of ring magnets 122 and 126 is each magnetically polarized so that the North pole of each of these magnets is directed away from the cylindrical axis of the plasma reactor 102. The ring magnets can comprise single magnetic rings or they can be constructed of a series of bar magnets in an array fastened together by means of a suitable ferrous band, as of steel. The bar magnets suitably can be of a size of about 0.5 inch high, one inch wide and one inch long. This magnet arrangement enhances etching uniformity by creating a ring cusp magnetic field that is circularly symmetrical about the reactor centerline, resulting in a more uniform plasma. The effect of these ring magnets on the magnetic fields within the processing chamber will be further illustrated and discussed with respect to FIG. 4.

There is still another advantage of this magnet arrangement. Because of the present configuration of the ring magnets, the substrate to be processed, generally a semiconductor wafer, can be passed into the chamber and onto the cathode by means of a slit-type entry port 128 in the side of the chamber 102 and between a row of magnets 124, 126. This has the advantage that the magnetic fields generated about the interior walls of the chamber do not have to be interrupted to provide an entry port, which arrangement would lead to plasma non-uniformities. Further, a simplified, stationary cathode mount can be provided within the chamber. The present system also provides convenient and easy access for robotic handling of the substrates to be processed. In addition, since the substrate to be processed can be admitted and extracted from the vacuum chamber in the same plane, the throughput is maximized for increased efficiency.

A further important feature of the present invention is a large pair of permanent ring magnets 130 and 132 fastened to the top of the reaction chamber 102. These magnets comprise the matching section to join the strong field of the ECR source to the ring cusp field. These magnets also improve the uniformity of the plasma and etching by removing magnetic field lines exiting the plasma source, terminating them before or shortly after they enter the etching chamber. The direction of magnetization is axial with respect to the chamber central axis and thus differs from the other ring magnets 120–126. For this specific plasma source, this ring magnet should be about three times the width of the ring magnets illustrated as 120–126. Suitably these large ring magnets 130, 132, can be about 1.5 inches high and one inch wide. The effect of these large ring magnets on the magnetic fields within the processing chamber 102 will also be further discussed with reference to FIG. 4.

As is well known, the reaction chamber 102 can also be optionally provided with instrument ports, view ports and the like, and other equipment, if desired to monitor the reactions taking place within the chamber during processing for example.

The substrate entry port 128 is a slot type port which is less than about one inch high and is wide enough to admit the desired substrate diameter. For example, state of the art semiconductor wafers are 6–8 inches in diameter. This port 128 is of standard manufacture except that some modification may be required to enable the port 128 to fit over the ring magnets 120–126. The advantage to a slot type port is that the substrates to be processed may be transferred into and out of the processing chamber 102 in the orientation and position within the chamber in which they will be processed. This greatly simplifies ingress and egress of the substrate and allows the cathode mount to be fixed, eliminating the need for complex mechanisms to raise and lower the substrate to the processing position. However, an adjustable substrate mount can of course be utilized if desired to optimize the position of the substrate within the substrate processing region around the substrate.

Figure 3:
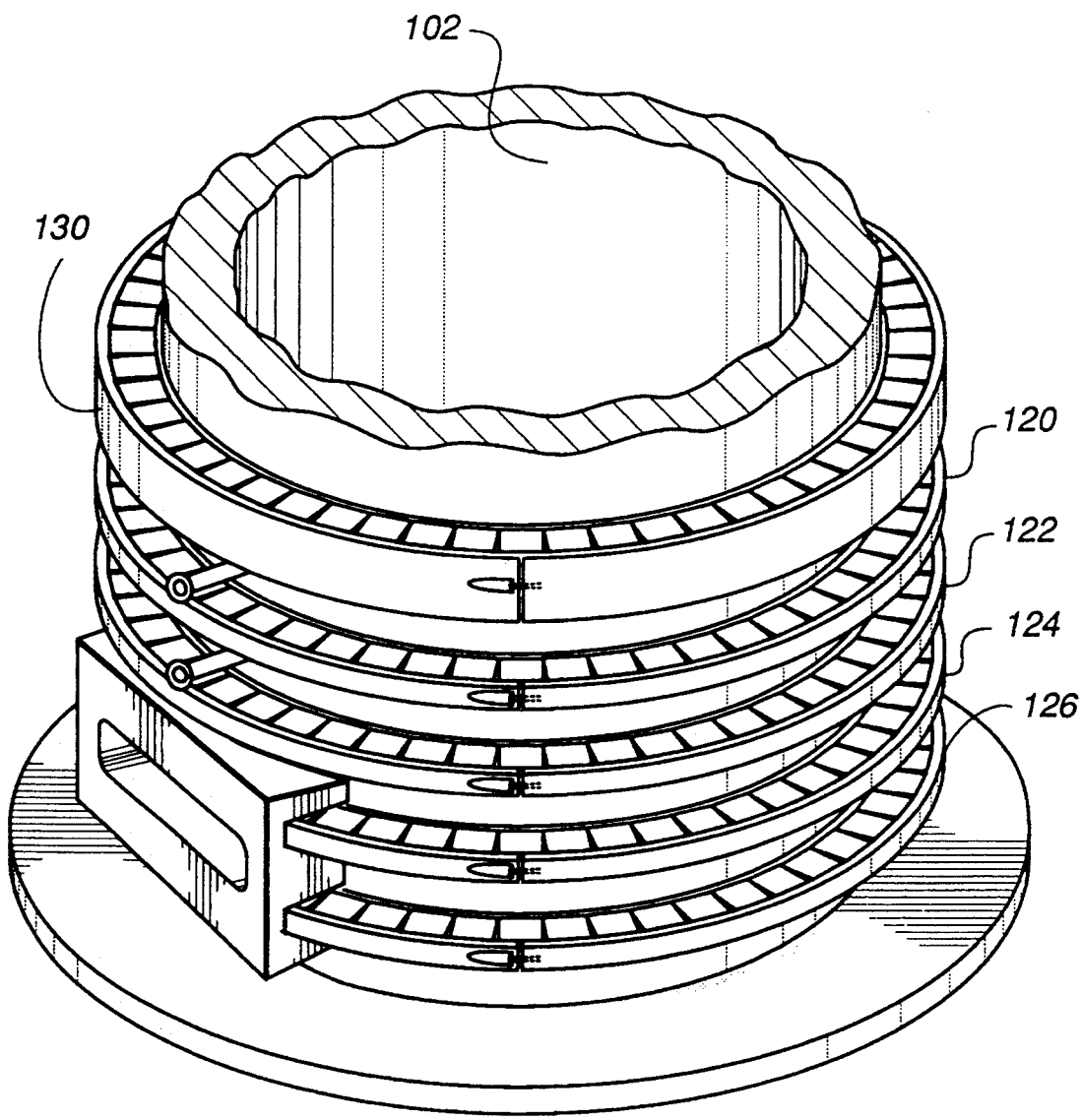
FIG. 3 is a cutaway view of the plasma etching chamber encircled by magnetic rings attached to the external wall of the chamber and illustrating a port for admitting and withdrawing the substrate to be processed therein.

FIG. 3 is a cutaway view of the chamber 102 in which the ring magnets 120 and 124 consist of a circular array of bar magnets. These bar magnets have their North poles oriented toward and normal to the cylindrical axis of the chamber 102. In the ring magnets 122 and 126, each of the bar magnets has its North pole oriented directly away from and normal to the cylindrical axis of the chamber 102.

Figure 4:
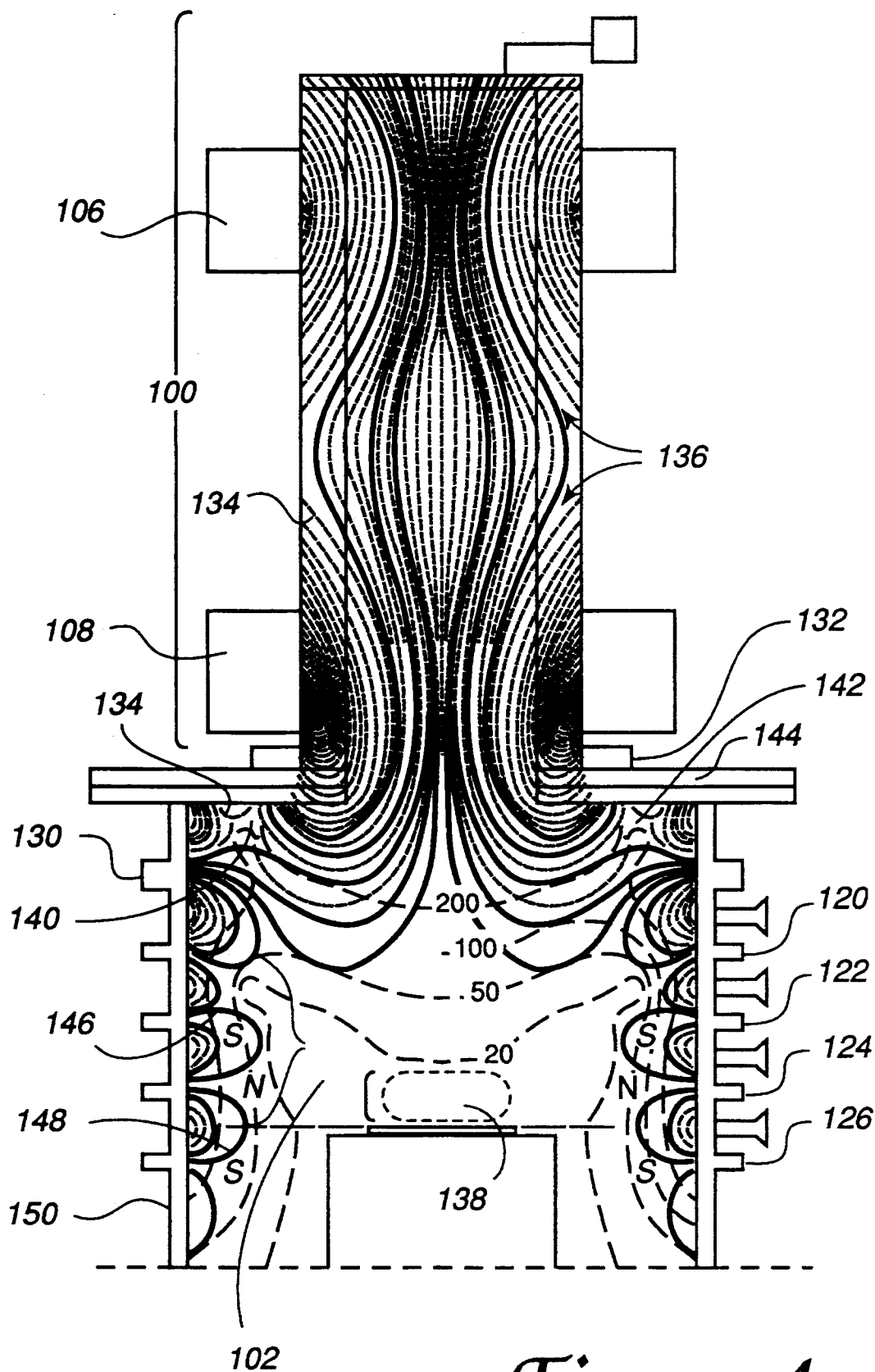
FIG. 4 is a vertical cross sectional view of the plasma chamber of the invention showing the spacing of various elements and the shapes of the magnetic field lines within the chamber.

FIG. 4 is a vertical cross section of the plasma reactor 98 illustrating the spacing of various elements and the shapes of the magnetic field lines generated in the reactor. Magnetic field lines 134 and 136 within the plasma source 100 are produced primarily by the coils 106 and 108. Because of the large amplitude of the magnetic field within the plasma source 100, this field would introduce non-uniformities into the ion density within the substrate processing region 138 at the top surface of the substrate during processing. The large ring magnet 132 is positioned and oriented with its North pole oriented vertically upward parallel to the cylindrical axis of the reactor 98 so that a large portion of the magnetic field lines 134 are bent in the region 140, in effect providing a return path for such field lines. The ring magnet 130 in turn has its North pole oriented perpendicular to and away from the cylindrical axis of the reactor 102 to divert additional field lines 136 away from the substrate processing region 138 in the region 142 and to an extent sufficient to reduce the magnetic field below about 20 Gauss at the surface of the substrate. Thus the magnetic field lines emanating from the plasma source 100 are pulled up towards the top 144 of the chamber 102. This greatly reduces the magnetic field in the vicinity of the substrate which would generate non-uniformities in the plasma near the substrate surface.

As can also be seen in FIG. 4, the ring magnets of alternating magnetic orientation create a series of curved magnetic fields 146, 148 which keep the electrons in the plasma from contacting the wall 150 of the chamber 102 where they would be lost. Thus the alternating ring magnets further enhance the efficiency of the plasma. The presence of the large ring magnets 130, 132, also cooperate with the ring magnets 120–126 to produce the ring multicusp magnetic field inside the reactor sidewall 150.

The spacing between the magnet ring pairs, such as 120 and 122 and the strengths of the magnetic fields produced by these magnets are selected so that their field lines do not significantly pass through the substrate processing region. Because these field lines penetrate into the processing chamber 102 a distance comparable to the spacing between these ring magnets, this spacing is selected to be on the order of or less than the spacing between the outer edge of the wafer and the inner edge of the sidewall 150. This spacing is typically at least two inches to provide a sufficient flow path for gases to enable the exhaust pump (not shown) to produce the desired processing pressure within the reactor 98. Thus the magnet rings may be separated by approximately two inch spaces. This choice of parameters produces a substantially field free region 138 that includes within it the substrate processing region. By 20 substantially "field free" is meant that the magnetic field within this region is less than about 20 Gauss. The dashed lines marked as 20, 50, 100 and 200 Gauss respectively in FIG. 4 confirm that the processing region 138 is substantially free of magnetic fields.

Although the invention has been described with respect to particular equipment and embodiments, various substitutions can be made without deviating from the invention as will be apparent to those skilled in the art, and are to be included herein. The size of the vacuum chamber will determine the size and spacing of the magnetic bands around the chamber, including both the larger permanent magnet band and the magnetic ring pairs. The nature of the source magnetic field will determine the size and strength of the necessary matching section which for the embodiment shown hereinabove was composed of magnet rings 130 and 132. The invention is only meant to be limited by the scope of the claims appended hereto.

We claim:

1. In a plasma reactor comprising a vacuum chamber for etching a substrate, the improvement which comprises magnet means for generating a ring multicusp magnetic field adjacent to an inner wall of said chamber and about the substrate processing region comprising alternating pairs of magnet rings fastened to the external wall of said chamber in a direction parallel to the plane of the substrate and parallel to each other, alternating magnet rings magnetically polarized in a direction opposite to each other wherein a permanent magnet ring is fastened to the upper portion of said chamber adjacent to a source of etch plasma to remove magnetic field lines from said plasma, the direction of magnetization of said permanent magnet ring being axial with the central axis of said chamber.

2. A reactor according to claim 1 wherein a slot-type substrate entry port is fitted to said chamber between said magnet means.

3. A reactor according to claim 1 wherein a maximum field strength of about 20 Gauss or less is present in a substrate processing region.

4. A plasma reactor comprising a plasma source mounted on a vacuum chamber, said vacuum chamber having fastened thereto magnet means for generating a ring multicusp magnetic field adjacent to an inner wall of said chamber and about a substrate processing region comprising alternating pairs of magnet rings fastened to the external wall of said chamber in a direction parallel to the plane of the substrate and parallel to each other, alternating magnet rings magnetically polarized in a direction opposite to each other and wherein a permanent magnet ring is fastened to the upper portion of said chamber adjacent to said plasma source to remove magnetic field lines from said plasma, the direction of magnetization of said permanent magnet ring being axial with the central axis of said chamber.

5. A plasma reactor according to claim 4 wherein said plasma source is an ECR source that produces a magnetic field in said plasma.

6. A plasma etch reactor comprising
a source of plasma mounted to a vacuum processing chamber including
a source of gas,
an exhaust system and
a cathode mount for a substrate to be processed, and having a permanent magnet ring surrounding the entrance of the plasma to said chamber which ring has a magnetic direction axial with respect to the central axis of said chamber, and which serves to remove magnetic field lines from said plasma;
at least two pairs of ring magnets fastened to said chamber surrounding the substrate processing region, each pair being oppositely polarized, to thereby form a series of magnetic cusps which serve to prevent plasma electrons from striking the wall of said chamber.

7. A reactor according to claim 6 wherein said pairs of ring magnets are parallel to each other and parallel to the plane of the substrate to be processed.

8. A reactor according to claim 6 wherein said substrate processing area has a maximum field strength of about 20 Gauss.

* * * * *